(12) United States Patent
Katoh et al.

(10) Patent No.: US 8,147,295 B2
(45) Date of Patent: Apr. 3, 2012

(54) METHOD OF POLISHING SILICON WAFER

(75) Inventors: Takeo Katoh, Tokyo (JP); Ryuichi Tanimoto, Tokyo (JP); Shinichi Ogata, Tokyo (JP); Takeru Takushima, Tokyo (JP); Kazushige Takaishi, Tokyo (JP)

(73) Assignee: Sumco Corporation, Minato-ku, Tokyo (JP)

( * ) Notice: Subject to any disclaimer, the term of this patent is extended or adjusted under 35 U.S.C. 154(b) by 443 days.

(21) Appl. No.: 12/472,480

(22) Filed: May 27, 2009

(65) Prior Publication Data

US 2009/0298394 A1 Dec. 3, 2009

(30) Foreign Application Priority Data

May 28, 2008 (JP) ................... 2008-139242

(51) Int. Cl.
*B24B 1/00* (2006.01)
(52) U.S. Cl. ............... 451/41; 451/60; 451/37
(58) Field of Classification Search .............. 451/41, 451/60, 37, 63
See application file for complete search history.

(56) References Cited

U.S. PATENT DOCUMENTS

| | | | |
|---|---|---|---|
| 6,206,756 B1 * | 3/2001 | Chopra et al. | 451/28 |
| 6,391,779 B1 * | 5/2002 | Skrovan | 438/691 |
| 6,458,012 B1 | 10/2002 | Hirokawa et al. | |
| 6,565,422 B1 * | 5/2003 | Homma et al. | 451/67 |
| 7,435,162 B2 * | 10/2008 | Kollodge | 451/41 |
| 2003/0176151 A1 * | 9/2003 | Tam et al. | 451/41 |

FOREIGN PATENT DOCUMENTS

| | | |
|---|---|---|
| EP | 0 757 378 A1 | 2/1997 |
| JP | 09-306881 A | 11/1997 |

* cited by examiner

*Primary Examiner* — Dung Van Nguyen
(74) *Attorney, Agent, or Firm* — Fitzpatrick, Cella, Harper & Scinto

(57) ABSTRACT

A silicon wafer is polished by applying a polishing solution substantially containing no abrasive grain onto a surface of a polishing pad having a given fixed grain bonded abrasive and then relatively sliding the polishing pad to a silicon wafer to polish the surface of the silicon wafer, wherein a hydroplane layer is formed by the polishing solution supplied between the surface of the silicon wafer and the surface of the polishing pad and a thickness of the hydroplane layer is controlled to change a polishing state of the surface of the silicon wafer.

8 Claims, No Drawings

METHOD OF POLISHING SILICON WAFER

BACKGROUND OF THE INVENTION

1. Field of the Invention

This invention relates to a method of polishing a silicon wafer in which a polishing solution substantially containing no abrasive grain is applied onto a surface of a polishing pad having a given fixed grain bonded abrasive and then the polishing pad is relatively slid to a silicon wafer to polish the surface of the silicon wafer.

2. Description of the Related Art

As the polishing solution used for polishing the surface of the silicon wafer is widely used an alkali solution containing silica particles as loose grain since early times. Also, a wet-type chemical mechanical polishing (mechanochemical polishing) with a polishing solution containing fine silica particles as abrasive grains and a soft synthetic leather polisher is general in the polishing of the silicon wafer. This polishing method is a method of combining the mechanical polishing action of the fine silica particles with the chemical polishing action of the alkaline solution, and is known to provide a mirror surface having excellent smoothness and crystallinity.

However, when the silicon wafer is polished with the polishing solution containing abrasive grains as mentioned above, it is possible to obtain a high processing speed and a certain wafer flatness, but there is a problem that the surface of the silicon wafer is damaged by the abrasive grains during the polishing to cause working strain on the wafer surface.

On the other hand, as a polishing method for preventing the working strain is known a chemical polishing method using an alkali solution substantially containing no abrasive grain as a polishing solution. However, when only the simple chemical polishing is carried out, there is a problem that the shape accuracy of the polished surface is poor, and when this chemical polishing is used in the polishing of the silicon wafer, there is a problem that the polishing speed is dramatically deteriorated since an oxide film naturally growing on the wafer surface cannot be completely removed or the removing time is too long.

In order to solve the above problems, therefore, the polishing process of the silicon wafer is divided into two stages of removing an oxide layer and polishing a silicon surface as disclosed in, for example, JP-A-H09-306881; that is, there is mentioned a so-called two-stage polishing method wherein the removal of the oxide layer is carried out with a polishing solution containing loose abrasive grains and the polishing of the silicon surface is carried out with a polishing solution substantially containing no abrasive grain. By using this method, it is possible to develop effects that the polishing time can be shortened in the removal of the oxide layer and that the occurrence of working strain can be suppressed on the surface of the silicon wafer.

When using the polishing method disclosed in JP-A-H09-306881, however, there is a fear that since it is difficult to control supply or homogenization of the abrasive grains and the polishing solution, the polishing amount becomes relatively large in a part of a silicon wafer while the polishing amount becomes relatively less in the other part thereof and hence the sufficient flatness is not obtained in the silicon wafer after the polishing. This tendency is particularly remarkable in case of a wafer having a large diameter.

SUMMARY OF THE INVENTION

It is, therefore, an object of the invention to provide a method of polishing a silicon wafer which has the same polishing speed and polishing accuracy as in the conventional polishing method and is particularly capable of maintaining an excellent flatness even when the wafer has a large diameter.

The inventors have made various studies in order to solve the above problems and found that in a method of polishing a silicon wafer by applying a polishing solution substantially containing no abrasive grain onto a surface of a polishing pad having a given fixed grain bonded abrasive and then relatively sliding the polishing pad to a silicon wafer to polish the surface of the silicon wafer, a hydroplane layer is formed by the polishing solution supplied between the surface of the silicon wafer and the surface of the polishing pad and a thickness thereof is controlled, whereby the surface of the silicon wafer can be uniformly polished with the polishing pad having the fixed grain bonded abrasive but also the polishing state (polishing with or without abrasive grains) can be changed with the control of the thickness of the hydroplane layer and hence the excellent flatness can be attained while maintaining the good polishing speed and polishing accuracy, and as a result, the invention has been accomplished.

In order to achieve the above object, the summary and construction of the invention are as follows.

(1) A method of polishing a silicon wafer by applying a polishing solution substantially containing no abrasive grain onto a surface of a polishing pad having a given fixed grain bonded abrasive and then relatively sliding the polishing pad to a silicon wafer to polish the surface of the silicon wafer, characterized in that a hydroplane layer is formed by the polishing solution supplied between the surface of the silicon wafer and the surface of the polishing pad and a thickness of the hydroplane layer is controlled to change a polishing state of the surface of the silicon wafer.

(2) The method of polishing a silicon wafer according to the item (1), which comprises a step of thinning the thickness of the hydroplane layer to remove an oxide film formed on the surface of the silicon wafer and a step of thickening the thickness of the hydroplane layer to perform finish polishing of the surface of the silicon wafer.

(3) The method of polishing a silicon wafer according to the item (1), wherein the thickness of the hydroplane layer is controlled by a pressure applied to the polishing pad in a vertical direction to the surface of the silicon wafer, a relative sliding speed of the polishing pad and/or a viscosity of the polishing solution.

(4) The method of polishing a silicon wafer according to the item (3), wherein the thickness of the hydroplane layer is further controlled by a hardness of the polishing pad and/or a size of contact area between the fixed grain bonded abrasive and the surface of the silicon wafer.

(5) The method of polishing a silicon wafer according to the item (1), wherein the thickness of the hydroplane layer is within a range of 10 nm to 10 µm.

(6) The method of polishing a silicon wafer according to the item (1), wherein the silicon wafer is a wafer having a large diameter of not less than 450 mm.

According to the invention, there can be provided a method of polishing a silicon wafer which has good polishing speed and polishing accuracy and is particularly capable of maintaining an excellent flatness even when a wafer has a large diameter.

DESCRIPTION OF THE PREFERRED EMBODIMENTS

The method of polishing a silicon wafer according to the invention is a method of polishing a silicon wafer in which a polishing solution substantially containing no abrasive grain is applied onto a surface of a polishing pad having a given fixed grain bonded abrasive and then the polishing pad is relatively slid to a silicon wafer to polish the surface of the silicon wafer. Each construction of the invention will be described in detail below.

The polishing pad according to the invention has a given fixed grain bonded abrasive. The fixed grain bonded abrasive means a solid material fixed onto the surface of the polishing pad and different from a matrix of the polishing pad, and there can be used ceramics such as silica, alumina and the like, a single substance or a compound such as a diamond, silicon carbide or the like, or a high polymer such as polyethylene, polypropylene or the like, and so on. Also, the form may be solid, gel or the like in addition to particles. Furthermore, as the silica can be used ones prepared either by a dry process (a combustion method, an arc method) or by a wet process (precipitation method, a sol-gel method).

The polishing solution according to the invention is applied onto the polishing pad (which is added dropwise onto a rotating polishing board through a nozzle), and its kind is not particularly limited as long as it serves as a polishing solution. However, it is required to use a polishing solution substantially containing no abrasive grain, because if a polishing solution containing abrasive grains is used, there are possibilities that working strain is caused on the surface of the silicon wafer and further the flatness of the wafer surface is deteriorated after the polishing. As the polishing solution can be used an aqueous ammonia solution having pH of about 8 to 11, or an alkali solution such as an aqueous KOH solution, an aqueous amine solution or the like. The term "a polishing solution substantially containing no abrasive grain" used herein means a polishing solution having a possibility of inevitably including components of abrasive grains but no possibility of positively including the components of abrasive grains.

In the polishing method of the invention, the surface of the silicon wafer is polished by relatively sliding the polishing pad to the silicon wafer. It is not necessary to limit the sliding method particularly. Thus, only the polishing pad or the silicon wafer may be moved for sliding, or both of them may be moved relatively for sliding.

The polishing method of the invention is characterized in that a hydroplane layer is formed by the polishing solution supplied between the surface of the silicon wafer and the surface of the polishing pad and a thickness of the hydroplane layer is controlled to change the polishing state of the surface of the silicon wafer. The term "hydroplane layer" used in the invention means a layer causing a phenomenon that the fixed grain bonded abrasive and the wafer surface are slid from each other at a contact state in the presence of the polishing solution (hydroplaning phenomenon), which is an effective means in a point that when the hydroplane layer is formed by the polishing solution, even if the polishing is conducted with the polishing pad having the fixed grain bonded abrasive on the surface thereof, the polishing can be conducted by the action of the hydroplane layer at a state of not contacting the fixed grain bonded abrasive with the surface of the silicon wafer at one time, or the action of the hydroplane layer can be reduced to conduct the polishing at a state of contacting the fixed grain bonded abrasive with the surface of the silicon wafer at the other time, and as a result, the same effect as in the two-stage polishing process is substantially developed without changing the polishing pad or the polishing solution, and further the excellent flatness can be attained on the surface of the silicon wafer.

Moreover, the method of polishing a silicon wafer according to the invention is preferable to comprise a step of thinning the thickness of the hydroplane layer to remove an oxide film formed on the surface of the silicon wafer and a step of thickening the thickness of the hydroplane layer to perform finish polishing of the surface of the silicon wafer. As described above, it is possible to change the polishing state by the control of the hydroplane layer. Concretely, when the thickness of the hydroplane layer is thin, the polishing with abrasive grains can be conducted on the oxide film, so that it is possible to provide an excellent flatness by the polishing while maintaining a good polishing speed. On the other hand, when the thickness of the hydroplane layer is thick, the same polishing as in the polishing substantially containing no abrasive grain can be conducted at a state of not contacting the fixed grain bonded abrasive with the surface of the wafer, so that the occurrence of working strain on the wafer surface can be suppressed.

Moreover, it is preferable that the thickness of the hydroplane layer is controlled by a pressure applied to the polishing pad in a vertical direction to the surface of the silicon wafer, a relative sliding speed of the polishing pad and/or a viscosity of the polishing solution. Because, when the control of the hydroplane layer is carried out by other methods, the influence on the thickness of the hydroplane layer is a small factor and there is a fear that the sufficient control can not be conducted.

In addition to the aforementioned control by the aforementioned pressure applied to the polishing pad, the relative sliding speed of the polishing pad and/or the viscosity of the polishing solution, it is more preferable that the thickness of the hydroplane layer is further controlled by a hardness of the polishing pad and/or a size of contact area between the fixed grain bonded abrasive and the surface of the silicon wafer from a viewpoint that a higher thickness control becomes possible.

Moreover, the thickness of the hydroplane layer is preferable to be within 10 nm to 10 µm by the thickness control. When the thickness is less than 10 nm, the distance between the fixed grain bonded abrasive and the silicon wafer surface becomes smaller and thus the frictional force of the fixed grain bonded abrasive becomes too large, and hence there is a fear of causing the working strain on the surface of the silicon wafer. While, when the thickness exceeds 10 µm, the distance between the fixed grain bonded abrasive and the silicon wafer surface becomes larger, and hence the removal of the oxide film is required to take a long time.

Moreover, the silicon wafer used in the invention is preferable to have a large diameter of not less than 450 mm. In case of the large-diameter wafer, there is a fear of deteriorating the flatness when the polishing is conducted by the conventional polishing method, whereas the effect by the invention can be developed remarkably.

Although the above is merely described with respect to one embodiment of the invention, various modifications may be made without departing from the scope of the appended claims.

Example 1

A surface of a silicon wafer having a diameter of 450 mm and a surface crystal orientation of (100) is polished for 10 minutes in total as follows. That is, an aqueous KOH solution containing no abrasive grain and a polishing solution containing water-soluble hydroxyethyl cellulose (viscosity: 1.5 cps) are applied on a surface of a polishing pad made of a polyurethane having a silica-containing fixed grain bonded abrasive, and such a polishing pad is relatively slid to the silicon wafer under such polishing conditions that a rotational speed of each of a stage loaded with the silicon wafer and the polishing pad is 60 rpm and a pressure applied to the polishing pad is changed from 300 gf/cm² (for the removal of an oxide film (1 minute)) to 150 gf/cm² (for polishing the silicon wafer surface (9 minutes)).

As a result of the observation on the polishing state by the adjustment of the pressure applied to the polishing pad, it is confirmed that the polishing is conducted at a state of contacting the fixed grain bonded abrasive with the surface of the silicon wafer (thickness of the hydroplane layer: 1 µm) during the removal of the oxide film (film thickness: about 1 nm) (about 1 minute) and that the fixed grain bonded abrasive is not contacted with the surface of the silicon wafer by the presence of the hydroplane layer (thickness: 5 µm) during the polishing of the silicon wafer surface (9 minutes).

Example 2

The polishing of the silicon wafer surface for 10 minutes in total is conducted under the same polishing conditions as in Example 1 except that the pressure applied to the polishing pad is fixed at 150 gf/cm² and the rotational speed of each of the stage loaded with the silicon wafer and the polishing pad is changed from 30 rpm (for the removal of the oxide film (1 minute)) to 60 rpm (for polishing the silicon wafer surface (9 minutes)).

As a result of the observation on the polishing state by the adjustment of the rotational speed of each of the stage and the polishing pad, it is confirmed that the polishing is conducted at a state of contacting the fixed grain bonded abrasive with the surface of the silicon wafer (thickness of the hydroplane layer: 1 µm) during the removal of the oxide film (film thickness: about 1 nm) (about 1 minute) and that the fixed grain bonded abrasive is not contacted with the surface of the silicon wafer by the presence of the hydroplane layer (thickness: 5 µm) during the polishing of the silicon wafer surface (9 minutes).

Comparative Example 1

The polishing of the silicon wafer surface for 10 minutes in total is conducted under the same conditions as in Example 1 except that an aqueous KOH solution including silica-containing loose abrasive grains and a polishing solution containing water-soluble hydroxyethyl cellulose (viscosity: 1.5 cps) are applied on a surface of the same polishing pad as in Example 1 and the pressure applied to the polishing pad is fixed at 150 gf/cm².

As a result of the observation on the polishing state, it is confirmed that the fixed grain bonded abrasive is not always contacted with the surface of the silicon wafer by the hydroplane layer of the polishing solution (thickness of the hydroplane layer: 5 µm) during the polishing (over 10 minutes).

Comparative Example 2

The polishing of the silicon wafer surface for 10 minutes in total is conducted under the same conditions as in Example 1 except that the pressure applied to the polishing pad is fixed at 150 gf/cm².

As a result of the observation on the polishing state, it is confirmed that the fixed grain bonded abrasive is not always contacted with the surface of the silicon wafer by the hydroplane layer of the polishing solution (thickness of the hydroplane layer: 5 µm) during the polishing (over 10 minutes).

Comparative Example 3

The polishing of the silicon wafer surface for 10 minutes in total is conducted under the same conditions as in Example 1 except that the pressure applied to the polishing pad is fixed at 300 gf/cm².

As a result of the observation on the polishing state, it is confirmed that the fixed grain bonded abrasive is always contacted with the surface of the silicon wafer (thickness of the hydroplane layer: 1 µm) during the polishing (over 10 minutes).

Comparative Example 4

The polishing of the silicon wafer surface for 10 minutes in total is conducted under the same conditions as in Example 1 except that the pressure applied to the polishing pad is fixed at 150 gf/cm² and the rotational speed of the polishing pad is fixed at 30 rpm.

As a result of the observation on the polishing state, it is confirmed that the fixed grain bonded abrasive is always contacted with the surface of the silicon wafer (thickness of the hydroplane layer: 1 µm) during the polishing (over 10 minutes).

Evaluation Method

With respect to each sample for evaluation prepared in the above are evaluated (1) the polishing amount and (2) the scratch state.

(1) The polishing amount is evaluated by measuring a thickness of the wafer (µm) reduced by polishing.

(2) The state of scratches (including strain generated by working) formed on the silicon wafer surface by polishing is evaluated by measuring the number of LPDs having size of not less than 0.1 µm in terms of PSL according to criteria of ◯: not more than 10, Δ: 11 to 100 and X: not less than 101.

The evaluation results are shown in Table 1.

TABLE 1

| | Presence or absence of fixed grain bonded abrasive in polishing pad | Presence or absence of abrasive grain in polishing solution | Viscosity of polishing solution (cps) | Rotational speed of each of stage and pad (rpm) | Pressure on polishing pad (gf/cm²) | Thickness of hydroplane layer (µm) | Polishing amount (µm) | Presence or absence of scratch |
|---|---|---|---|---|---|---|---|---|
| Example 1 | Presence | — | 1.5 | 60 | 300→150 | 1→5 | 5 | ◯ |
| Example 2 | Presence | — | 1.5 | 30→60 | 150 | 1→5 | 5 | ◯ |
| Comparative Example 1 | — | Presence | 1.5 | 60 | 150 | 5 | 6 | Δ |
| Comparative Example 2 | Presence | — | 1.5 | 60 | 150 | 5 | 0 | — |

TABLE 1-continued

|  | Presence or absence of fixed grain bonded abrasive in polishing pad | Presence or absence of abrasive grain in polishing solution | Viscosity of polishing solution (cps) | Rotational speed of each of stage and pad (rpm) | Pressure on polishing pad (gf/cm$^2$) | Thickness of hydroplane layer (μm) | Polishing amount (μm) | Presence or absence of scratch |
|---|---|---|---|---|---|---|---|---|
| Comparative Example 3 | Presence | — | 1.5 | 60 | 300 | 1 | 8 | x |
| Comparative Example 4 | Presence | — | 1.5 | 30 | 150 | 1 | 2 | x |

As seen from Table 1, in Examples 1 and 2, the polishing state is controlled by the pressure applied to the polishing pad and the rotational speed of the polishing pad, whereby the polishing can be conducted at a state of contacting the fixed grain bonded abrasive with the surface of the silicon wafer during the removal of the oxide film (film thickness: about 1 nm) (1 minute) and at a state of not contacting the fixed grain bonded abrasive with the surface of the silicon wafer by the hydroplane layer during the polishing of the silicon wafer surface (9 minutes), so that the surface of the wafer after the polishing has no oxide film and few scratches and is good state.

In Comparative Example 1, the polishing can be conducted without contacting the fixed grain bonded abrasive with the surface of the silicon wafer by the hydroplane layer, but some scratches are observed on the wafer surface due to loose abrasive grains contained in the polishing solution. In Comparative Example 2, abrasive grains are not included in the polishing pad nor in the polishing solution, and hence the oxide film formed on the surface of the silicon wafer cannot be removed and the effect by the polishing is not developed. In Comparative Examples 3 and 4, the polishing state is not well controlled by the pressure applied to the polishing pad and the rotational speed of the polishing pad, so that the hydroplane layer cannot be formed, and hence the polishing amount is increased or many scratches are generated on the surface of the silicon wafer.

According to the invention, there can be provided a method of polishing a silicon wafer which has good polishing speed and polishing accuracy and is particularly capable of maintaining an excellent flatness even when a wafer has a large diameter.

What is claimed is:

1. A method of polishing a surface of a silicon wafer, comprising steps of:
   applying a polishing solution containing substantially no abrasive grain onto a surface of a polishing pad having a fixed grain bonded abrasive;
   sliding the surface of the polishing pad relative to the surface of the silicon wafer to polish the surface of the silicon wafer;
   reducing a thickness of a hydroplane layer formed by the polishing solution present between the surface of the silicon wafer and the surface of the polishing pad to a thickness in a range of 10 nm to 1 μm, to remove an oxide film formed on the surface of the silicon wafer; and,
   after the reducing step, increasing the thickness of the hydroplane layer to a thickness in a range of 5 μm to 10 μm, to perform finish polishing of the surface of the silicon wafer.

2. The method of polishing a surface of a silicon wafer according to claim 1, wherein the thickness of the hydroplane layer is controlled by a pressure applied to the polishing pad in a vertical direction to the surface of the silicon wafer, a relative sliding speed of the polishing pad and/or a viscosity of the polishing solution.

3. The method of polishing a surface of a silicon wafer according to claim 2, wherein the thickness of the hydroplane layer is further controlled by a hardness of the polishing pad and/or a size of a contact area between the fixed grain bonded abrasive of the polishing pad and the surface of the silicon wafer.

4. The method of polishing a surface of a silicon wafer according to claim 1, wherein the silicon wafer has a diameter of not less than 450 mm.

5. A method of polishing a surface of a silicon wafer, comprising steps of:
   applying a polishing solution containing substantially no abrasive grain onto a surface of a polishing pad having a fixed grain bonded abrasive;
   sliding the surface of the polishing pad relative to the surface of the silicon wafer to polish the surface of the silicon wafer;
   reducing a thickness of a hydroplane layer formed by the polishing solution present between the surface of the silicon wafer and the surface of the polishing pad, to remove an oxide film formed on the surface of the silicon wafer; and
   increasing the thickness of the hydroplane layer, to perform finish polishing of the surface of the silicon wafer,
   wherein the thickness of the hydroplane layer is changed in a controlled manner by changing a pressure applied to the polishing pad in a vertical direction to the surface of the silicon wafer, a relative sliding speed of the polishing pad and/or a viscosity of the polishing solution, and a hardness of the polishing pad and/or a size of a contact area between the fixed grain bonded abrasive of the polishing pad and the surface of the silicon wafer.

6. A method of polishing a surface of a silicon wafer, comprising steps of:
   applying a polishing solution containing substantially no abrasive grain onto a surface of a polishing pad having a fixed grain bonded abrasive;
   sliding the surface of the polishing pad relative to the surface of the silicon wafer to polish the surface of the silicon wafer;
   reducing a thickness of a hydroplane layer formed by the polishing solution present between the surface of the silicon wafer and the surface of the polishing pad in a first polish, to remove an oxide film formed on the surface of the silicon wafer; and,
   after the reducing step, increasing the thickness of the hydroplane layer in a second polish, to perform finish polishing of the surface of the silicon wafer, wherein the thickness of the hydroplane layer is changed in a controlled manner by one of: changing a pressure applied to the polishing pad in a vertical direction to the surface of the silicon wafer while keeping a relative sliding speed of the polishing pad constant, and keeping the pressure applied to the polishing pad in the vertical direction to the surface of the silicon wafer constant while changing the relative sliding speed of the polishing pad.

7. A method of polishing a surface of a silicon wafer according to claim 6, wherein the thickness of the hydroplane layer is changed in a controlled manner between the first polish and the second polish by decreasing a pressure applied to the polishing pad in the vertical direction to the surface of the silicon wafer while keeping the relative sliding speed of the polishing pad constant.

8. A method of polishing a surface of a silicon wafer according to claim 6, wherein the thickness of the hydroplane layer is changed in a controlled manner between the first polish and the second polish by increasing the relative sliding speed of the polishing pad while keeping the pressure applied to the polishing pad in the vertical direction to the surface of the silicon wafer constant.

* * * * *